United States Patent
Tsai et al.

(10) Patent No.: US 9,780,089 B2
(45) Date of Patent: Oct. 3, 2017

(54) BIPOLAR JUNCTION TRANSISTOR LAYOUT

(71) Applicant: TAIWAN SEMICONDUCTOR MANUFACTURING CO., LTD., Hsinchu (TW)

(72) Inventors: Han-Min Tsai, Hsinchu (TW); Chi-Feng Huang, Zhubei (TW); Chia-Chung Chen, Keelung (TW); Victor Chiang Liang, Hsinchu (TW); Hsiao-Chun Lee, Chiayi (TW); Shou-Chun Chou, Hsinchu (TW); Shu-Fang Fu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/339,779

(22) Filed: Oct. 31, 2016

(65) Prior Publication Data

US 2017/0047323 A1 Feb. 16, 2017

Related U.S. Application Data

(62) Division of application No. 14/814,464, filed on Jul. 30, 2015, now Pat. No. 9,484,408.

(51) Int. Cl.
| | |
|---|---|
| *H01L 29/66* | (2006.01) |
| *H01L 27/082* | (2006.01) |
| *H01L 29/06* | (2006.01) |
| *H01L 29/08* | (2006.01) |
| *H01L 29/10* | (2006.01) |

(Continued)

(52) U.S. Cl.
CPC ........ *H01L 27/082* (2013.01); *H01L 27/0207* (2013.01); *H01L 29/0649* (2013.01); *H01L 29/0692* (2013.01); *H01L 29/0808* (2013.01); *H01L 29/0821* (2013.01); *H01L 29/1008* (2013.01); *H01L 29/41708* (2013.01); *H01L 29/42304* (2013.01); *H01L 29/735* (2013.01); *H01L 23/562* (2013.01)

(58) Field of Classification Search
None
See application file for complete search history.

(56) References Cited

U.S. PATENT DOCUMENTS

| | | | |
|---|---|---|---|
| 8,115,280 B2 | 2/2012 | Chen et al. | |
| 8,159,048 B2 * | 4/2012 | Apel | H01L 29/0692 257/573 |

(Continued)

OTHER PUBLICATIONS

Zhixin Yan et al., "Gate-Controlled Lateral PNP BJT: Characteristics, Modeling and Circuit Applications," IEEE Transactions on electron devices, vol. 44, No. 1, Jan. 1997.

(Continued)

*Primary Examiner* — Cory Eskridge
(74) *Attorney, Agent, or Firm* — Maschoff Brennan

(57) ABSTRACT

A bipolar junction transistor includes an emitter, a base contact, a collector and a shallow trench isolation. The base contact has two base fingers that form a corner to receive the emitter. The collector has two collector fingers extending along the base fingers of the base contact. The shallow trench isolation is disposed in between the emitter and the base contact and in between the base contact and the collector.

20 Claims, 7 Drawing Sheets

(51) Int. Cl.
*H01L 29/735* (2006.01)
*H01L 27/02* (2006.01)
*H01L 29/417* (2006.01)
*H01L 29/423* (2006.01)
*H01L 23/00* (2006.01)

(56) References Cited

U.S. PATENT DOCUMENTS

2006/0108665 A1* 5/2006 Kurokawa .......... H01L 27/0605
257/592
2010/0301453 A1* 12/2010 Chung ................ H01L 27/0823
257/574

OTHER PUBLICATIONS

S. Verdonckt-Vandebroek, et al. "High-Gain Lateral Bipolar Action in a MOSFET Structure," IEEE Transactions on electron devices. vol. 38. No. 11, Nov. 1991.

* cited by examiner

BIPOLAR JUNCTION TRANSISTOR LAYOUT

PRIORITY CLAIM AND CROSS-REFERENCE

The present application is a Divisional Application of the U.S. patent application Ser. No. 14/814,464, filed Jul. 30, 2015, the entire contents of which are hereby incorporated herein by reference.

BACKGROUND

Bipolar junction transistors (BJTs) are incorporated in various semiconductor devices. BJTs can be categorized as NPN BJTs (NBJTs) and PNP BJTs (PBJTs). A BJT includes collector C, base B and emitter E. Typically, the base B and collector C collectively form a closed ring encircle the emitter E in the central region. BJT is typically formed using a CMOS compatible process. These BJTs are referred to as vertical or lateral BJT. Hybrid mode devices, i.e., which exhibit both BJT and CMOS functions is now well established. The integration of CMOS transistors with BJT provides advantages, for example, high speed, high drive, hybrid voltage performance with analog-digital capabilities. The hybrid mode benefits in many applications such as telecommunication devices. However, as the device dimension continues to shrink, a challenge remains in optimising the performance of CMOS and BJTs.

A variety of factors may affect BJT performance. At least one potential factor is the particular geometry employed for directing current. A need, therefore, continues to exist for BJT geometries that result in improved transistor performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
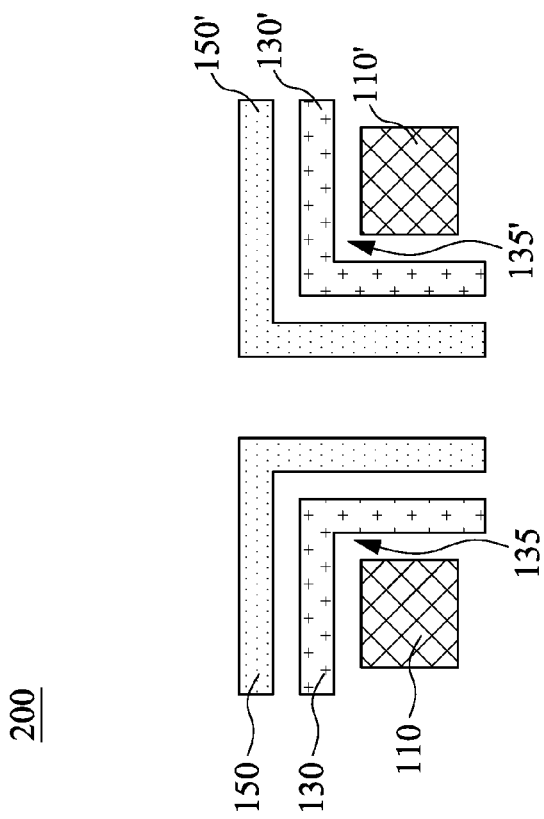
FIG. 1 is a top view of a bipolar junction transistor in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In CMOS technology, both MOS and bipolar transistors can be applied to generate the basic signals for temperature sensors and voltage references. In the bipolar transistors the base-emitter voltage and the saturation current is used for the extraction of the basic signals. The base-emitter voltage and saturation current of the bipolar transistors show better temperature characteristics than the threshold voltage and mobility of the MOS transistors. Thus, most of the circuits of temperature sensors and voltage references apply bipolar transistors as the basic components.

Many circuits including voltage regulators, analog-digital and digital-analog converters require a voltage reference that is as precise as possible. The overall device performance relies on the voltage reference. It means the voltage reference would ideally be PVT independent where P stands for manufacturing process variations, V for supply voltage and T for temperature. Bandgap reference circuits cancel out two opposing variations caused by temperature. To cancel out the temperature coefficients, they must have opposing signs, namely a negative (NTC) and a positive (PTC). A bipolar junction transistor (BJT) is able to provide the NTC and PTC voltages.

When considering an ideal signal processing, the overall accuracy will be limited by the accuracy of the basic signals. These basic signals are the base-emitter voltage $V_{BE}$ of a BJT and the difference $\Delta V_{BE}$ of two of these base-emitter voltages. From these two voltages, the intrinsic signals, the thermal voltage, and the bandgap voltage $V_{go}$ are then extracted.

As previously indicated, a variety of factors may affect bipolar junction transistor performance. The current gain ($\beta$) and power added efficiency performance of a transistor may be affected by undesirable capacitance between collector and base contacts and by undesirable extrinsic resistance in series with the base. Current gain is frequently considerations affecting overall design, which may involve the selection of particular semiconductor materials for the transistors and the particular transistor geometry. The geometry effect includes active gate area, distance between device centres, measured area parameter, measured distance parameter and the like. Furthermore, since silicon and transistor are not perfectly isotropic, to keep current flow at the same direction is an existing challenge. Therefore, current gain will depend on the difference in both the injection areas and injection barriers. For example, current gain in a conventional NPN transistor relies on at least in part on how much more the emitter is doped n-type with respect to p-type doping. To satisfy a high gain transistor, the emitter is usually heavily doped while the base contact doping volume remains low. If the base contact resistivity should maintain at a low level, it suggests the width of the base contact should be widened. However, widening the base contact results in an increase in the charge carrier transit time across the base region, which may slow the device.

A voltage reference circuit typically has a pair of BJTs in the circuit. Each of the BJTs includes an emitter (E), a base contact (B) and a collector (C). The base contact defines a perimeter, and the emitter is disposed in the central region in the perimeter. The collector, on the other hand, encircles the base contact along its periphery. The conventional BJT resembles a multiple ring structure having the emitter as the concentric centre. The collector current ($I_C$) is derived primarily from the electrons injected along the sidewall portion of the emitter-base junction. The electrons diffuse from the emitter to the collector throughout the entire depth of the emitter. In the case of a 2 by 2 PNP BJT circuit, current gain (defined as collector current divided by base current, $I_C/I_B$) may reduce to less than 1 when the number of nodes gradually increases to more than 28. The low accuracy in BJT is likely to result from mismatching of components, drift, temperature effects, 1/f noise and mechanical stress. These factors may add on the inaccuracy with more complicated integrated circuit design.

The geometry of a transistor, in addition to the other previously mentioned factors, may affect capacitance and resistance of the device greatly. For example, an increase in an emitter region near base contacts may result in less resistance present when current flows from the emitter to the base. Likewise, the collector-base capacitance is associated with the emitter region and base contact.

Please refer to FIG. 1. FIG. 1 is a top view of a bipolar junction transistor (BJT) structure 100 in accordance with some embodiments of the instant disclosure. The BJT structure 100 includes a pair of BJT units 1. The BJT unit 1 includes an emitter 110, a base contact 130 and a collector 150. In the instant embodiment, the emitter 110 is substantially square with each side having equal length. However, it should be understood that the emitter 110 may adapt other geometric configuration including triangle, rectangle or hexagon, and the instant disclosure is not limited thereto. The base contact 130 has two base fingers 131 and 133. The base fingers 131, 133 join at one end and together form a corner 135 as shown in FIG. 1. The other end of the base fingers 131, 133 remains free without any contact with other components. In the instant embodiment, the length of the base fingers 131, 133 is substantially equal and is greater than the side of the emitter 110. The length of the base fingers 131, 133 should be at least equal to the length of a side of the emitter 110 so as to form the corner 135 for receiving the emitter 110 in its semi-opened perimeter. The length of the base fingers 131, 133 may not be uniform as long as it is greater than the corresponding side of the emitter 110.

The two fingers 131, 133 may join to form a substantially orthogonal corner 135 as shown in FIG. 1. However, the angle created by the two base fingers 131, 133 may vary from a sharp corner to a blunt one, but the corner 135 may not exceed 180°. That is to say, the two sides of the corner 135, i.e., two base fingers 131, 133, can be distinguished from one another when view from the top. As shown in FIG. 1, the two base fingers 131, 133 stretch along the contour of the emitter 110 and are substantially parallel to the corresponding sides of the emitter 110. It should be understood that the corner 135 may follow the shape of the emitter 110. Alternatively, base fingers 131, 133 do not need to exactly match the contour of the emitter 110. For example, the base finger 133 may slightly slant inwardly toward the other base finger 131 to create a sharper corner 135. In other words, the base fingers 131, 133 may not be symmetrical in relation to the emitter 110.

The collector 150 includes a pair of collector fingers 151 and 153. The collector fingers 151, 153 extend along the direction of the base fingers 131, 133 respectively. More specifically, the collector fingers 151, 153 follows the sidewall of the base fingers 131, 133 and further enlarge the semi-opened perimeter defined by the base fingers 131, 133. In general, the configuration of the collector 150 echo the base contact 130 since the current orientation is affected by the sidewall arrangement of the base contact 130 and the collector 150. The length of the collector fingers 151, 153 has to at least enclose the outer periphery of the base contact 130. A shallow trench isolation 105 is disposed in between the emitter 110, base contact 130 and the collector 150 and separate the elements apart.

The instant disclosure provides a semi-opened transistor where the base contact 130 and the collector 150 do not enclose the emitter from all around. The base contact 130 has two base fingers 131, 133 that are distinctively pointed toward different directions, such that the corner 135 is created at the intersection of the two base fingers 131, 133. The emitter 110 is accommodated in the corner 135 but not fully surrounded by the base contact 130 in the instant disclosure. The base fingers 131, 133 closely follows the contour of the emitter 110, and therefore when the current flows from the emitter 110 to the base contact 130, it follows the sidewall built by the base fingers 131, 133 with higher directionality. The current then travels to the collector 150, and since the collector fingers 151, 153 goes along the periphery of the base fingers 131, 133, the current flow orientation is well maintained along its route. The base fingers 131, 133 direct the current flow to its desirable orientation. The semi-opened base contact 130 and collector 150 have a more reduced area from ¼ to ½ compared to a closed BJT. When the same volume of current is applied, the overall current density increases. The collector area and the current gain β ($I_C/I_B$) correlate inversely, and thus a reduction in collector area results in an increase in current gain. The current flow orientation is limited to the direction pointed by the base fingers 131, 133, and the current gain is increased because area reduction on the collector 150. The BJT unit 1 provides a higher gain and a more directional current flow.

Referring to FIG. 1, the BJT structure 100 includes a pair of BJT units 1. A second transistor also has an emitter 110', a base contact 130' and a collector 150'. The spatial relationship between the emitter 110', base contact 130' and collector 150' is identical to the aforementioned transistor. The additional transistor is positioned as a mirror image to the other. More specifically, the corners 135, 135' open toward each other, such that the emitters 110, 110' face to each other with only shallow trench isolation 105 separating the two units apart. As shown in FIG. 1, the free end of the base finger 133 points to the free end of the base contact 130', and the same applies to the collector finger 153 to the collector 153'.

Figure 2:
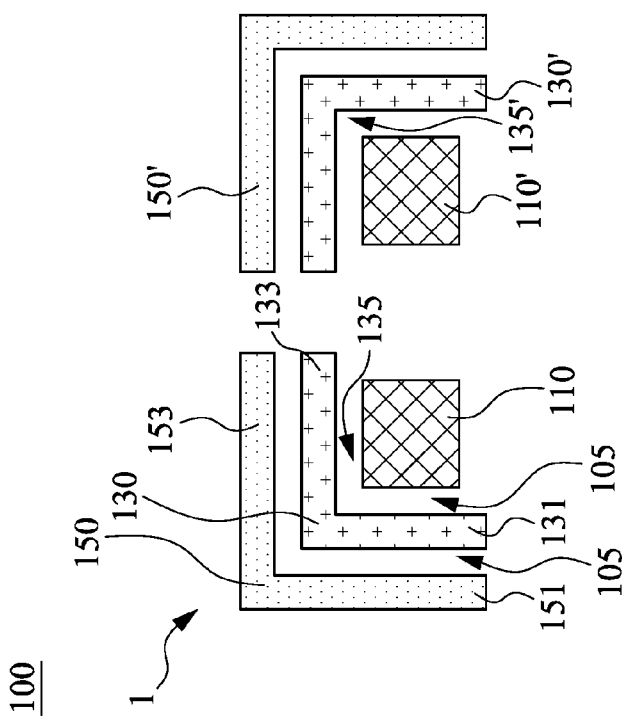
FIG. 2 is a top view of a bipolar junction transistor in accordance with some embodiments of the instant disclosure.

Please refer to FIG. 2. FIG. 2 is a top view of a bipolar junction transistor structure 200 in accordance with some embodiments of the instant disclosure. In the instant embodiment, the pair of transistors is in different arrangement compared to the BJT structure 100 shown in FIG. 1. The corners 135, 135' opens opposite to each other, and the collector fingers of the collectors 150, 150' are back to back, only to be separated by shallow trench isolation. Likewise, the additional transistor is in mirror-image symmetry with the other one, but unlike the pattern shown in FIG. 1, the corners of the BJT structure 200 face away from one another.

It should be understood that, the embodiments are examples of paired transistors in accordance with some embodiments of the instant disclosure. The paired transistors may not be in perfect symmetry. For example, the additional transistor may not align exactly to the other one. A slight shift in alignment, such as upward or downward from a top view, is allowed in the paired transistors. Alternatively, the paired transistors do not need to be mirror image to one another. More specifically, one of the transistors may have a sharp angle corner while the other one has a normal angle corner.

Figure 3:
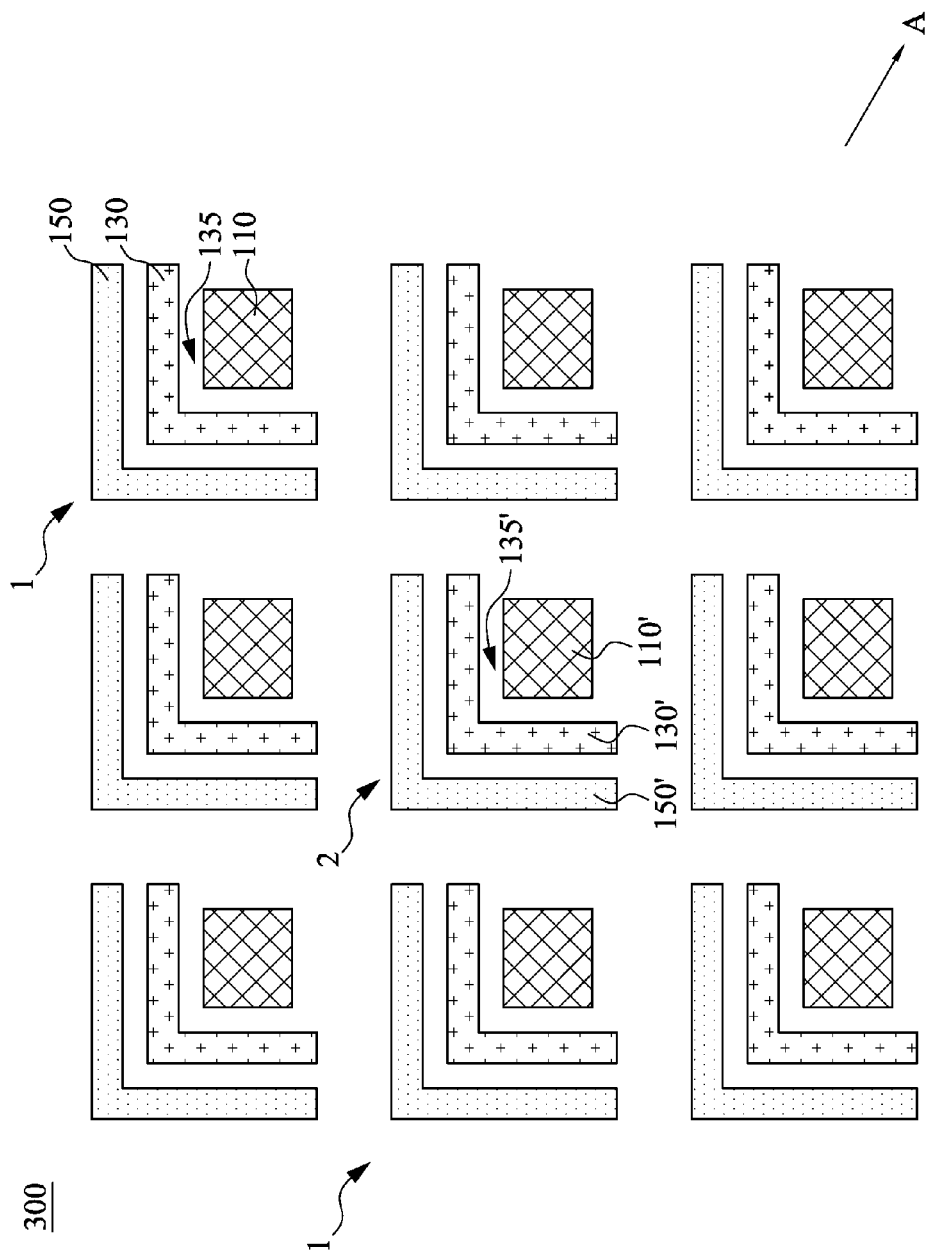
FIG. 3 is a top view of a bipolar junction transistor assembly in accordance with some embodiments of the instant disclosure.

Please refer to FIG. 3. FIG. 3 is a top view of a bipolar junction transistor assembly 300 in accordance with some embodiments of the instant disclosure. In the instant embodiment, the BJT assembly 300 includes eight first units 1 and a second unit 2. Each of the first units 1 is identical to the BJT unit 1 shown in FIG. 1, and hereafter do not repeat its structure to avoid redundancy. It should be understood that the configuration of the base contact 130 and the collector 150 may vary according to design requirement. The first units 1 are arranged in a ring array to define an enclosure at the central region of the ring. The central region is an area that is sufficient to accommodate a single second unit 2 without overlapping its outermost boundary, collector 150'. The ring array may form into a shape of, for example, triangle, rectangle, trapezoid, or other geometric configuration having at least three distinctive sides. In the instant embodiment, the ring array is arranged in a shape of square with equal number of first units 1 on each side. The shallow trench isolation is disposed between each pair of the first units 1 and equally separates them apart. The emitter 110, base contact 130 and collector 150 of a first unit 1 are aligned with the immediately adjacent first unit 1, such that this 3 by 3 square ring provides clear cut at its four sides whose periphery has four orthogonal corners. The corners 135 of the first units 1 opens toward a same direction A, as indicated in FIG. 3.

The second unit 2 is disposed in the central region of the ring array created by the first units 1. The emitter 110', base contact 130' and collector 150' of the second unit 2 are aligned with the neighbouring first units 1 in which the base fingers and collector fingers are substantially levelled. The corner 135' of the second unit 2 opens toward the same direction as the rest of the first units 1 which is the direction A. This symmetry of the BJT assembly 300 provides an improved bandgap reference voltage where the current flow is stable with uniform direction as the electrons travel along the clearly angled fingers of the base contact 130, 130' and collector 150, 150'.

Figure 4:
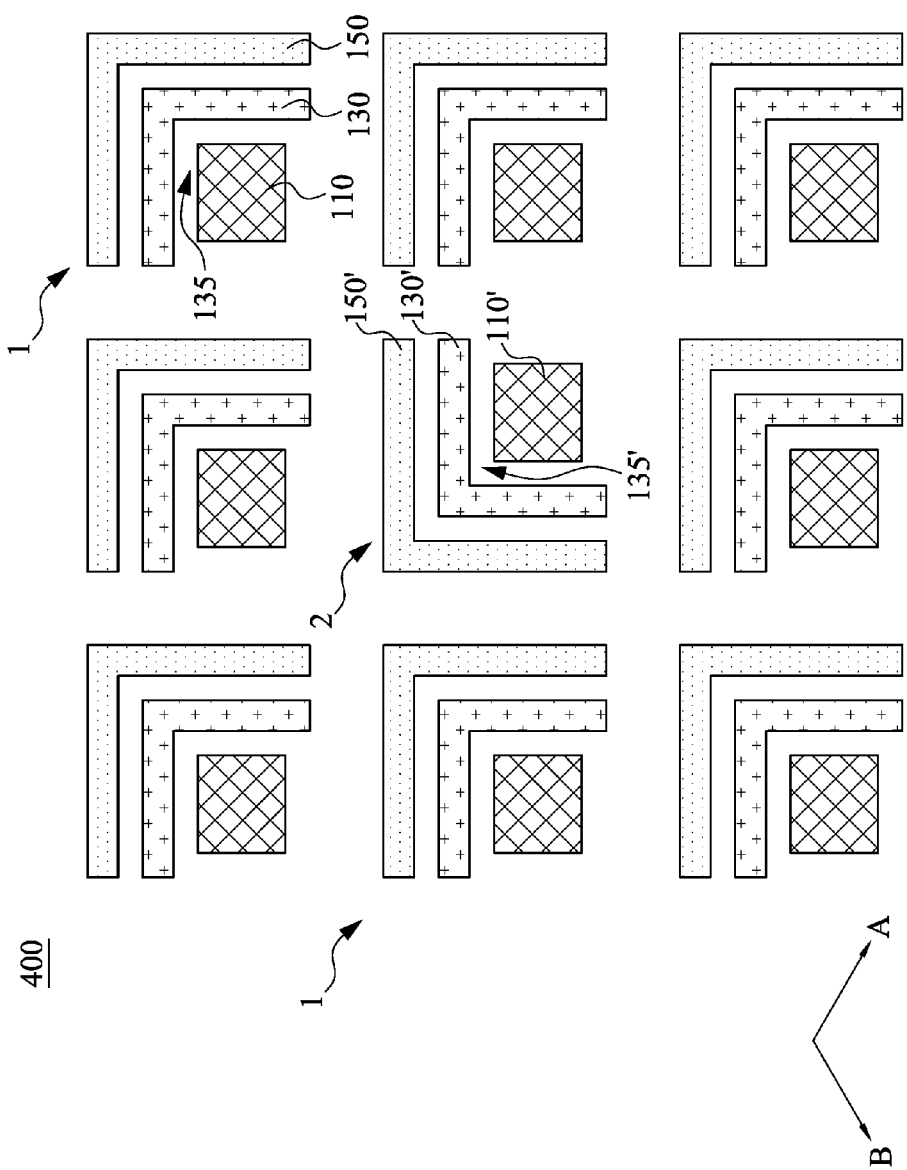
FIG. 4 is a top view of a bipolar junction transistor assembly in accordance with some embodiments of the instant disclosure.

Please refer to FIG. 4. The BJT assembly 400 includes eight first units 1 and a single one second unit 2 as the BJT assembly 300. Each of the first units 1 and the second unit 2 is identical to the BJT unit 1 as shown in FIG. 1, and the difference arises from the corner 135, 135' orientation. The first units 1 are arranged in a square ring array and the second unit 2 is disposed in the central region defined by the square ring. The corners 135 of the first units 1 opens toward a direction B as indicated in FIG. 4, while the corner 135' of the second unit 2 opens toward the direction A. The 9 BJT units are still in a square ring array, while the corner 135' of the second unit 2 opens toward a different direction with respect to the corners 135 of the first units 1. In other words, the pattern of the BJT assembly is interrupted by the second unit 2 where the second unit 2 flips, and the corner 135' opens substantially 90-degree away from the corners 135.

Figure 5:
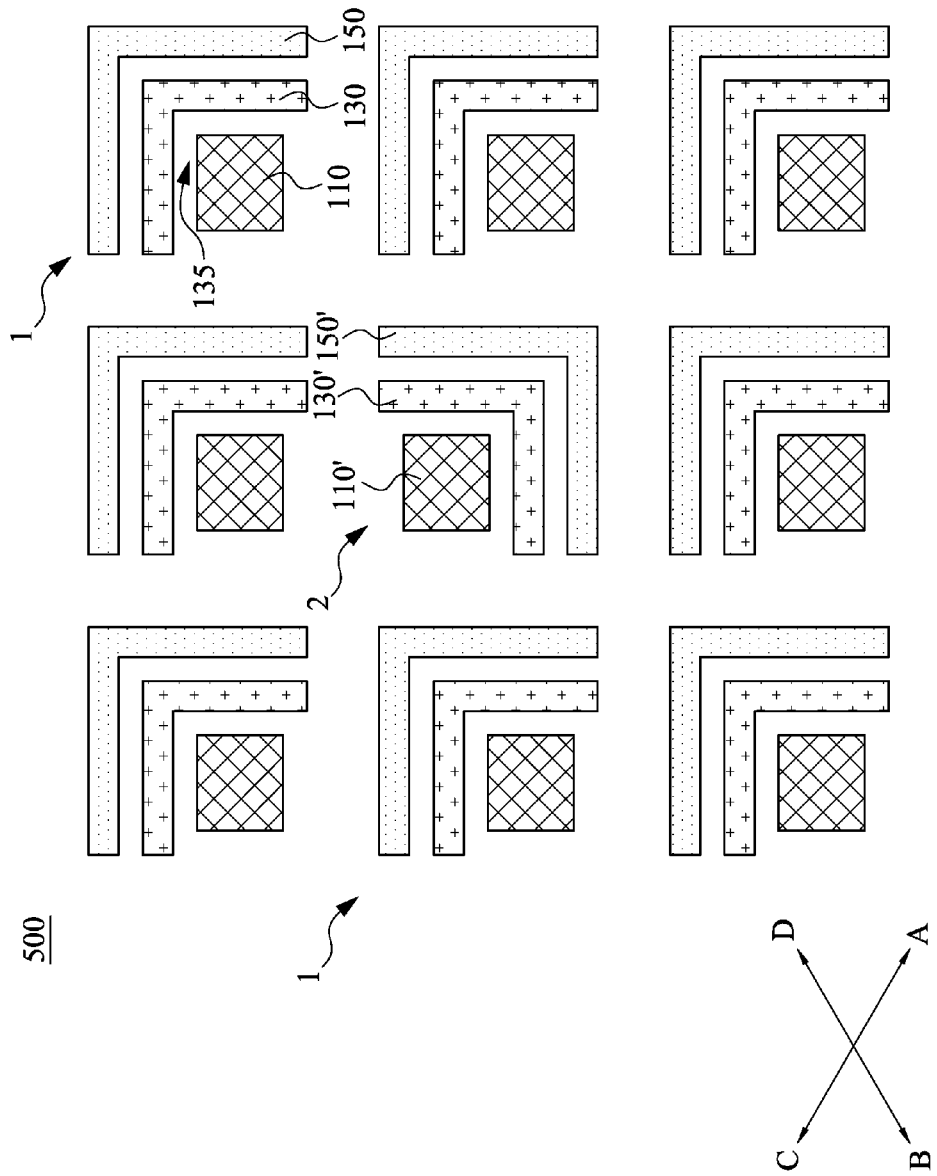
FIG. 5 is a top view of a bipolar junction transistor assembly in accordance with some embodiments of the instant disclosure.

Please refer to FIG. 5. The BJT assembly 500 is similar to the BJT assembly 400, while the difference arises from the second unit 2 in the BJT assembly. The corners 135 of the first units 1 opens toward the direction B as indicated in FIG. 5, while the corner 135' of the second unit 2 opens toward a direction C. The 9 BJT units are still in a square ring array, while the corner 135' of the second unit 2 opens toward a different direction with respect to the corners 135 of the first units 1. Again, the second unit 2 interrupts the pattern of the BJT assembly 500 by opening toward the direction C.

Figure 6:
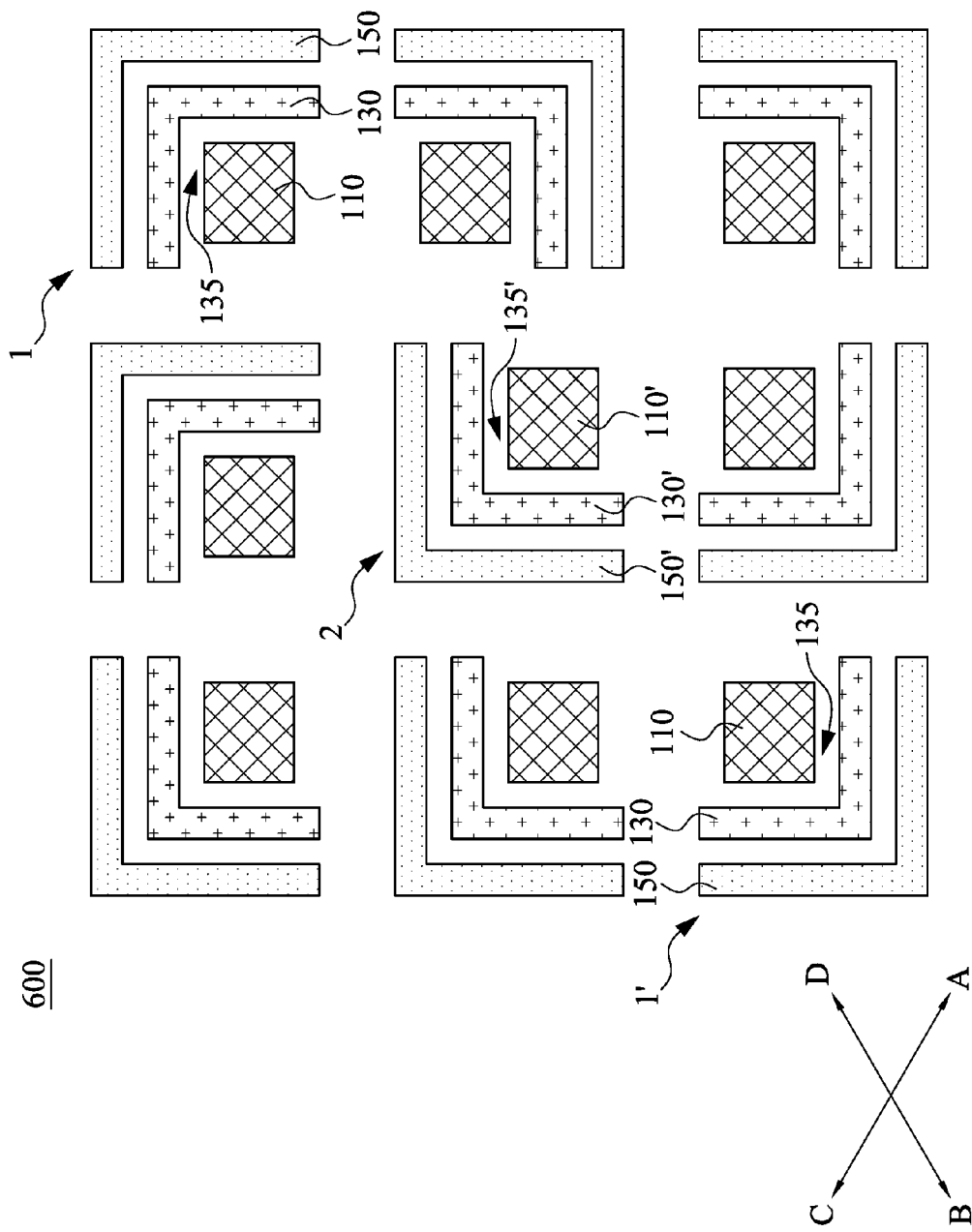
FIG. 6 is a top view of a bipolar junction transistor assembly in accordance with some embodiments of the instant disclosure.
Figure 7:
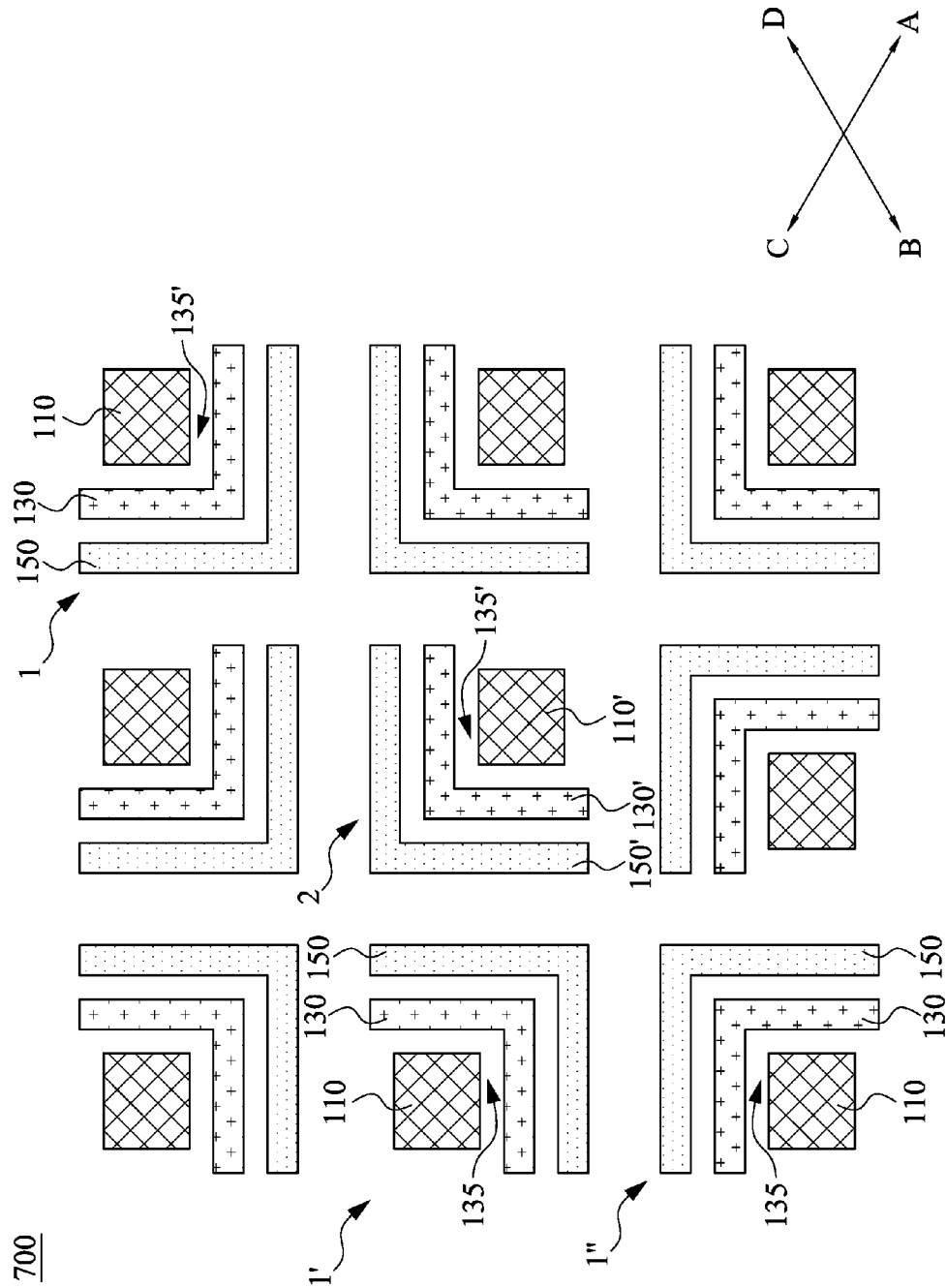
FIG. 7 is a top view of a bipolar junction transistor assembly in accordance with some embodiments of the instant disclosure.

Please refer to FIG. 6. The BJT assembly 600 is similar to the previously described BJT assembly. However, in the ring array, the first units 1 open to different directions. For example, one of the first unit 1 opens to the direction B, another first unit 1' opens to a direction D, as indicated in the FIG. 6, and still another first unit opens to the direction C. The orientation of the corner opening is random, while, at the same time, the square ring array geometry is maintained. The second unit 2 is disposed in the central region, and the corner 135' opens to the direction A. Please refer to FIG. 7. The BJT assembly 700 is similar to the BJT assembly 600, and the difference arises from the orientation of the first and second units 1, 2. One of the first units 1 opens toward the direction D, one of the first units 1' opens toward the direction C, and still another first unit 1" opens toward the direction B. The other first units open to direction A, B, C or D respectively. The second unit 2 opens to direction A in the instant embodiment. It should be understood that each of the first and second units 1, 2 may open to any of the four directions as indicated in the FIG. 7, and the instant embodiment is an exemplary embodiment of the instant disclosure.

The mismatching in the thermal coefficient of expansion (TCE) of different materials of the wafers and packages causes mechanical stress, which is temperature-dependent and most likely time-dependent. The stress induces changes in the $I_C$ ($V_{BE}$) characteristics of bipolar transistors, and it is the main cause of the long-term drift and hysteresis during thermal cycling of bandgap references. Although silicon has no mechanical hysteresis, many materials, such as epoxy or plastic, show features of viscoelasticity, which are responsible for mechanical stress in the silicon die. The geometry and material properties of the material directly affect the stress characteristics.

As previously discussed, the area of the device overall may have an effect on the thermal considerations, for example, due to current flow and non-uniform heating. A transistor cell can be thought of as constituted of a collection of smaller sub-cells that are arranged in parallel. Within a transistor cell, non-uniformities in temperature may result in current 'hogging' and localized thermal runaway currents. The power dissipation level at which this may occur depends at least in part on transistor geometry and overall cell size. The abovementioned transistors have a great reduction in area compared with conventional closed transistors. Nonetheless, depending on the particular application, other issues may be considered to determine an appropriate bandgap reference circuit. Since the mechanical stress is largely caused by mismatching in the TCE of different materials, heat dissipation is a concern of the instant disclosure.

Figure 8:
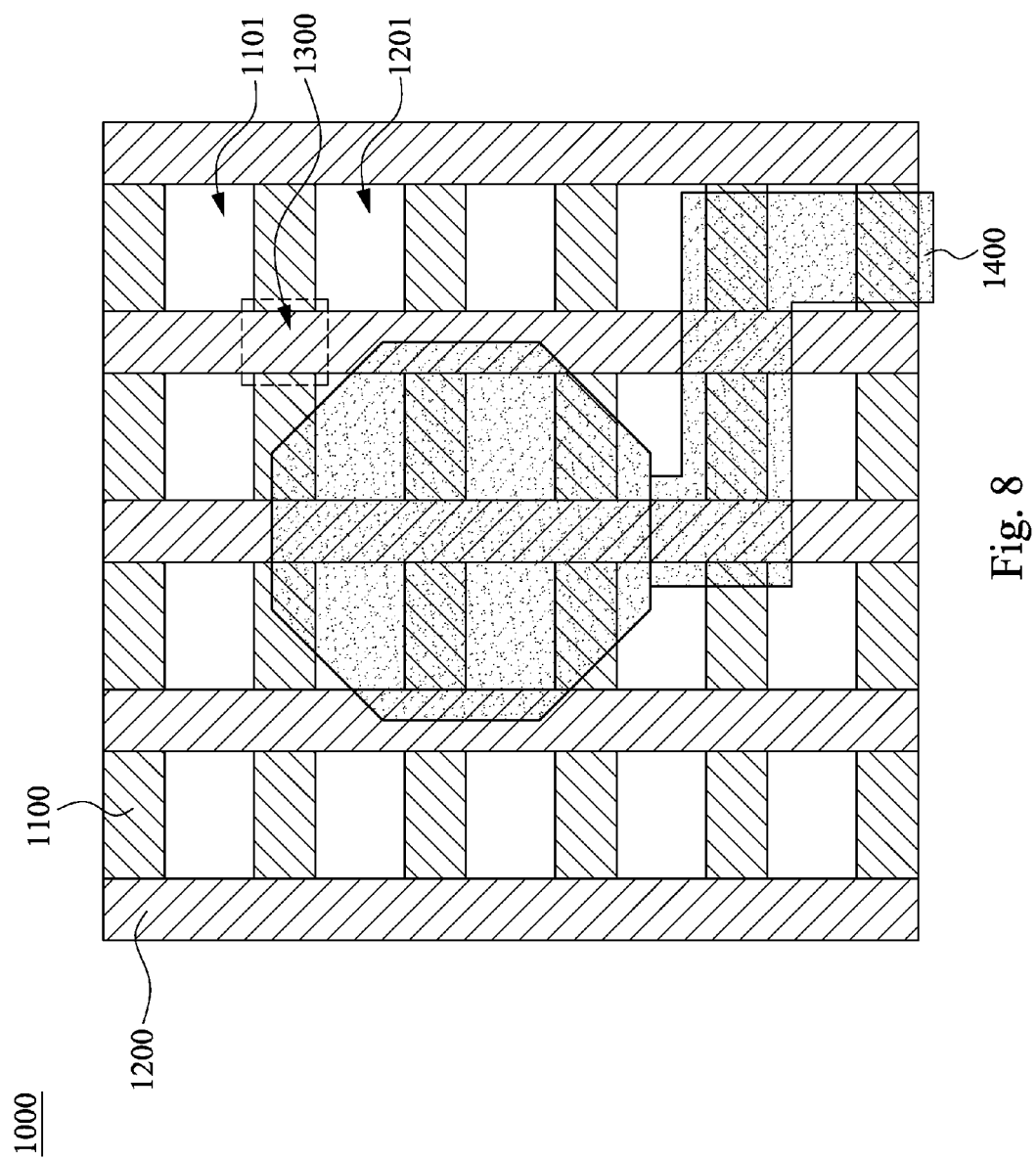
FIG. 8 is a top view of a power mesh in accordance with some embodiments of the instant disclosure.

Please refer to FIG. 8. FIG. 8 is a top view of a power mesh 1000 in accordance with some embodiments of the instant disclosure. To reduce stress effect and have an improved performance on the bandgap reference circuit the power mesh 1000 is provided. The transistors have to be temperature independent, and the power mesh 1000 can minimize stress effect in the reference circuit. The power mesh 1000 includes a plurality of first strips 1100 and a plurality of second strips 1200. The first strips 1100 are in parallel alignment, and each of the first strips are spaced apart, and therefore a plurality of first gaps 1101 is created between each of the first strips 1100. The second strips 1200 are disposed on the top of the first strips 1100 and spaced apart from one another with equal interval, and therefore a plurality of second gas 1201 is created between each of the second strips 1200. The first gaps 1101 may not be uniform in width, and the second gaps 1201 may span with different width. The first strips 1100 can be seen as one layer and the second strips 1200 can be seen as another layer on top of the first strips 1100.

The first strips 1100 follow a first strip direction while the second strips 1200 follows a second strip direction that is orthogonal to the first strips 1100 in the instant embodiment. In some embodiments of the instant disclosure, the first strip direction may not be orthogonal to the second strip direction. For example, the first strip direction may be horizontal from the top view, and the second strips 1200 follow a second strip direction which results in different shapes of the second gaps 1201. Likewise, the second strip direction may be vertical from the top view, and the first strips 1100 follow a first strip direction which results in different shapes of the first gaps 1101. In other words, the pattern created by the power mesh 1000 may vary according to the first and second strip directions but the first and second strip directions are not in parallel.

As shown in FIG. 8, the second strips 1200 are disposed on the first strips 1100, and an intersection 1300 is created at which the first and second strips 1100, 1200 overlap. At the intersection 1300, the first strip 1100 goes horizontally from top view and the second strip 1200 goes vertically. The first and second gaps 1101, 1201 are retained but visually divided into smaller cells.

An input/output unit 1400 is disposed on the first and second strips 1100, 1200. The scaffold created by the first and second strips 1100, 1200 allows sufficient heat dissipation when the circuit is under full operation because of larger eyes of the mesh. In addition, the heat can be transferred more quickly through the linear network by solid conducting. The materials of the first and second strips 1100, 1200 may be, for example, copper or aluminium copper (AlCu). The first and second strips 1100, 1200 may be made of the same or different materials. An input/output unit 1400 is disposed on the power mesh 1000, and the input/output unit 1400 is largely in contact with the second strips 1200. That is to say, the input/output unit 1400 is slightly lifted above the first strips 1100 because the second strips 1200 are like a second layer disposed on the first strips 1100. The overall heat dissipation is improved because the first and second gaps 1101, 1201, i.e., the eyes of the mesh, allow air ventilation. Furthermore, the elevation created by overlapping the second strips 1200 over the first strips 1100 also contributes to a better thermal cycling.

In one embodiment of the instant disclosure, 5 bands of first strips 1100 are arranged in parallel with equal intervals, and 5 bands of second strips 1200 are disposed on the first strips 1100 to form a 5 by 5 power mesh 1000 as shown in FIG. 8. According to empirical experiment, the power mesh 1000 shows approximately 2% reduction in temperature-dependent stress effect.

Overall, the geometry of the BJT is altered to a semi-opened state, which the base contact and the collector have a reduction in the area but a clear-cut current direction route. Furthermore, the power mesh improves the accuracy of the bandgap reference circuit by providing a better heat dissipation architecture.

One aspect of the instant disclosure is related to a bipolar junction transistor including an emitter, a base contact, a collector and a shallow trench isolation. The base contact has two base fingers that form a corner to receive the emitter. The collector has two collector fingers extending along the base fingers of the base contact. The shallow trench isolation is disposed in between the emitter and the base contact and in between the base contact and the collector.

Another aspect of the instant disclosure is related to a bipolar junction transistor assembly including at least eight first units and at least one second unit. The first units are arranged in a ring array and the second unit is disposed in the ring array. Each of the first and second units includes an emitter, a base contact, a collector and a shallow trench isolation. The base contact has two base fingers that form a corner to receive the emitter. The collector has two collector fingers extending along the base fingers of the base contact. The shallow trench isolation is disposed in between the emitter and the base contact and in between the base contact and the collector.

Still another aspect of the instant disclosure is related to a power mesh structure including a plurality of first strips and a plurality of second strips. The first strips are disposed along a first strip direction. The second strips are disposed on the first strips along a second strip direction. The first and second strip directions are non-parallel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A bipolar junction transistor (BJT) assembly comprising:
  at least eight first units arranged in a ring array; and
  at least one second unit disposed in the ring array,
  wherein each of the first and second units comprises:
    an emitter;
    a base contact including two base fingers that define a corner to receive the emitter;
    a collector including two collector fingers extending along the base fingers; and a shallow trench isolation disposed in between the emitter and the base contact and in between the base contact and the collector.

2. The bipolar junction transistor assembly of claim 1, wherein the emitter is substantially square in a top view.

3. The bipolar junction transistor assembly of claim 2, wherein each side of the emitter is substantially parallel to one of the two base fingers.

4. The bipolar junction transistor assembly of claim 1, wherein the two collector fingers of the collector are orthogonal.

5. The bipolar junction transistor assembly of claim 1, wherein the ring array is polygonal.

6. The bipolar junction transistor assembly of claim 1, wherein the ring array has four sides, and each side has an equal number of first units.

7. The bipolar junction transistor assembly of claim 1, wherein the corners of the first units open toward a first direction, and the corner of the second unit opens toward the first direction.

8. The bipolar junction transistor assembly of claim 1, wherein the corners of the first units open toward a first direction, and the corner of the second unit opens toward a second direction substantially orthogonal to the first direction.

9. The bipolar junction transistor assembly of claim 1, wherein the corners of the first units open toward different directions.

10. The bipolar junction transistor assembly of claim 1, wherein the first units are spaced apart.

11. The bipolar junction transistor assembly of claim 1, wherein the base fingers are of different length.

12. A bipolar junction transistor (BJT) assembly comprising:
    a plurality of emitters spaced apart and arranged in an array;
    a plurality of base contacts, each of the base contacts including two base fingers that define a corner to receive one of the emitter;
    a plurality of collectors, each of the collectors including two collector fingers extending along the base fingers; and
    a shallow trench isolation disposed in between the emitter and the base contact and in between the base contact and the collector.

13. The bipolar junction transistor (BJT) assembly of claim 12, wherein the two base fingers of each of the base contacts are substantially normal.

14. The bipolar junction transistor (BJT) assembly of claim 12, wherein the two base fingers of each of the base contacts and the two collector fingers of each of the collectors are substantially parallel.

15. The bipolar junction transistor (BJT) assembly of claim 12, wherein the corners of the base contacts opens toward a first direction.

16. The bipolar junction transistor (BJT) assembly of claim 12, wherein the corners of the base contacts opens toward different directions.

17. The bipolar junction transistor (BJT) assembly of claim 12, wherein the emitters are arranged in a square array.

18. The bipolar junction transistor (BJT) assembly of claim 12, wherein the two base fingers are of different length.

19. A bipolar junction transistor (BJT) assembly comprising:
    a plurality of emitters spaced apart and arranged in an array;
    a plurality of base contacts, each of the base contacts encloses a portion of one of the emitter;
    a plurality of collectors, each of the collectors enclosing one of the base contacts; and
    a shallow trench isolation disposed in between the emitter and the base contact and in between the base contact and the collector.

20. The bipolar junction transistor (BJT) assembly of claim 19, wherein each of the base contacts includes two base fingers that define a pocket to receive one of the emitter.

\* \* \* \* \*